United States Patent [19]

Cade

[11] Patent Number: 4,534,804

[45] Date of Patent: Aug. 13, 1985

[54] LASER PROCESS FOR FORMING IDENTICALLY POSITIONED ALIGNMENT MARKS ON THE OPPOSITE SIDES OF A SEMICONDUCTOR WAFER

[75] Inventor: Paul E. Cade, Colchester, Vt.

[73] Assignee: International Business Machines Corporation, Armonk, N.Y.

[21] Appl. No.: 620,644

[22] Filed: Jun. 14, 1984

[51] Int. Cl.³ ............... H01C 7/00; H01L 21/265; H01L 21/66
[52] U.S. Cl. .................... 148/1.5; 29/574; 29/576 B; 148/187; 357/91; 427/53.1
[58] Field of Search ............... 148/1.5, 187; 29/574, 29/576 B; 357/91; 427/53.1

[56] References Cited

U.S. PATENT DOCUMENTS

| | | | |
|---|---|---|---|
| 3,752,589 | 8/1973 | Kobayashi | 356/172 |
| 4,046,985 | 9/1977 | Gates | 219/121 L |
| 4,131,487 | 12/1978 | Pearce et al. | 148/1.5 |
| 4,137,100 | 1/1979 | Zaleckas | 148/1.5 |
| 4,174,217 | 11/1979 | Flatley | 148/187 |
| 4,217,570 | 8/1980 | Holmes | 338/308 |
| 4,257,827 | 3/1981 | Schwuttke et al. | 148/1.5 |
| 4,318,752 | 3/1982 | Tien | 148/1.5 |
| 4,319,119 | 3/1982 | Runge | 219/121 LM |
| 4,348,809 | 9/1982 | Sasaki | 29/574 |
| 4,415,373 | 11/1983 | Pressley | 148/1.5 |

FOREIGN PATENT DOCUMENTS 108287  9/1978  Japan .................... 29/574

*Primary Examiner*—Upendra Roy
*Attorney, Agent, or Firm*—Sughrue, Mion, Zinn, Macpeak and Seas

[57] ABSTRACT

A laser beam is used to scribe an alignment mark on the back side of a lightly doped substrate of a silicon wafer containing an heavily doped internal layer. The wavelength of the laser beam is chosen such that it passes through the lightly doped substrate without absorption but is absorbed in the heavily doped internal layer to produce therein a defect which has the same position as the scribed alignment mark. Subsequent heating of the wafer causes the defect to migrate upwardly through a lightly doped epitaxial layer to the front side of the wafer and produce therein a visible mirror image of the scriber alignment mark.

5 Claims, 11 Drawing Figures

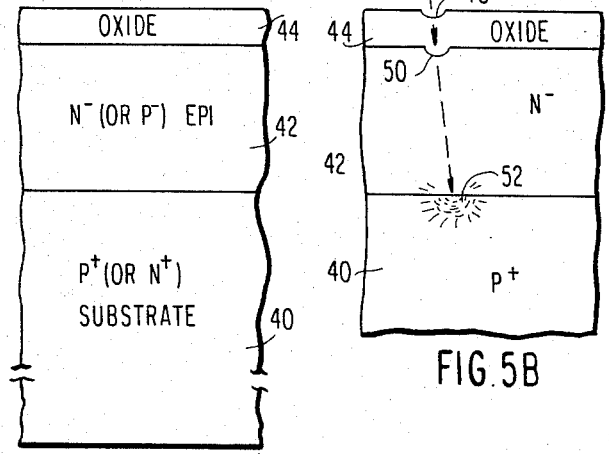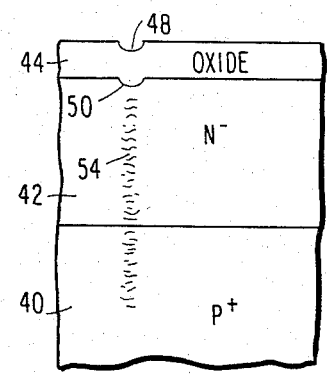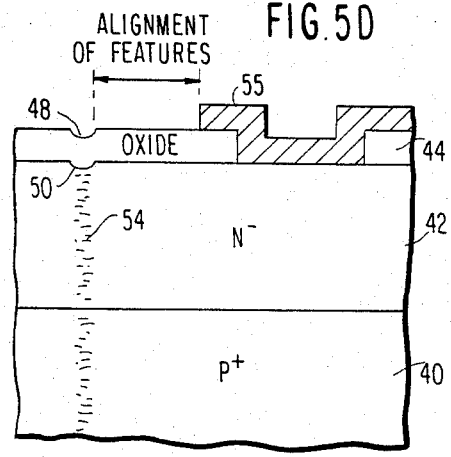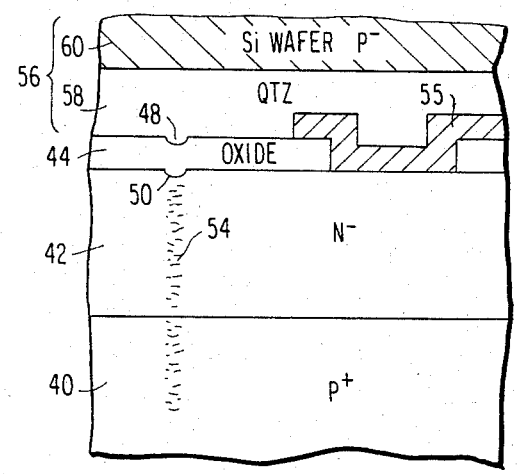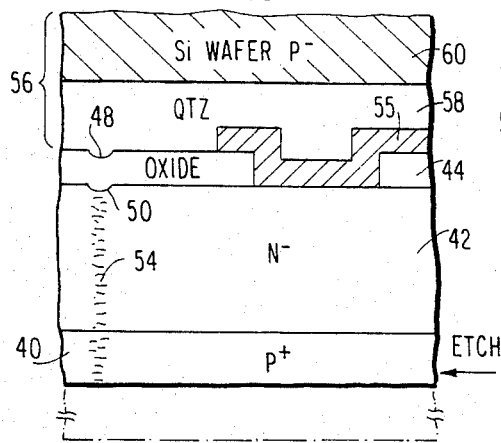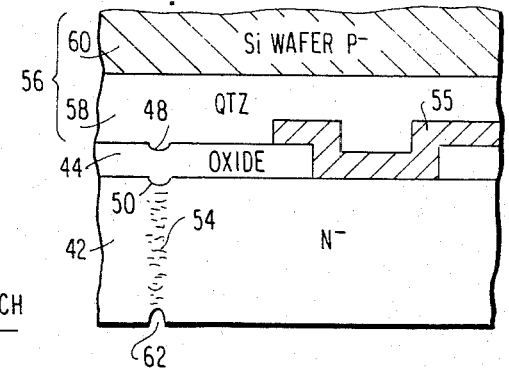

LASER PROCESS FOR FORMING IDENTICALLY POSITIONED ALIGNMENT MARKS ON THE OPPOSITE SIDES OF A SEMICONDUCTOR WAFER

BACKGROUND OF THE INVENTION

1. Field of the Invention

This invention relates generally to the field of precisely aligning photoresist masks to both the front and back sides of a silicon wafer and, more particularly, to a fixture-less process employing a laser beam for scribing and alignment mark on the back side of a wafer having an heavily doped interior layer in which microscopic defects are induced by the laser beam and, then, heating the wafer to cause the defects to propagate to the front side of a wafer where they appear as an identically positioned image of the alignment mark scribed on the back side.

2. Description of the Prior Art

The problem of aligning both the back and front sides of a semiconductor wafer to a photographic mask has been recognized in the prior art. U.S. Pat. No. 3,752,589—Kobayashi discloses an optical-mechanical means and method for aligning the pattern of a photographic mask on one side of a wafer to a pattern on the opposite side, wherein individual optical images of the patterns on both sides of the wafer are obtained and, then, the position of the mask is mechanically adjusted until the two optical images are aligned.

U.S. Pat. No. 4,046,985—Gates discloses an optical-mechanical semiconductor wafer alignment apparatus for repeatedly aligning the back sides of wafers to the axis of a kerf-cutting laser. First, a transparent mask, having on its front side a duplicate of the device pattern and of the alignment marks on the opaque wafers, is visually aligned to the laser, and the apparatus is set to maintain this alignment. Thus, subsequently inserted opaque semiconductor wafers, having the same alignment marks, will travel through the apparatus along the same path as the transparent mask, including inversion of the wafers, so that their back sides are aligned to the laser whose beam automatically impinges on the kerf areas between the devices.

U.S. Pat. No. 4,318,752—Tien discloses a method of forming a p-doped area in an n-doped layer of a plural layer semiconductor body by passing a laser beam through a first p-doped layer into an adjacent n-layer which absorbs the laser beam energy and generates heat to cause diffusion of the p-doped layer into the n-doped layer. The wavelength of the laser beam is chosen such that is passes through the p-doped layer without absorption.

U.S. Pat. No. 4,131,487—Pearce et al discloses a process for gettering a semiconductor wafer with a laser beam, wherein a laser beam is directed upon the back side of the wafer to create lattice damage and strain in the back side. Subsequent heating of the wafer releases the strain to attract mobile defects from the front side of the wafer to the back side.

SUMMARY OF THE INVENTION

Identically positioned alignment marks on both the front and back sides of a semiconductor wafer are created by using a laser beam to scribe an alignment mark on the back side of the wafer. The wavelength of the laser beam is chosen such that it passes through the lightly doped wafer without absorption but is absorbed by a following heavily doped semiconductor layer to generate therein heat and resulting defects. The semiconductor wafer is then heated to cause the defects to migrate through a lightly doped epitaxial layer to the front surface thereof in which there is formed an identically positioned image of the mark scribed on the back side.

Thus, the main object of the invention is to provide a simple process for aligning the front and back sides of a semiconductor wafer without the need for an expensive and unwieldly mechanical alignment fixture or apparatus.

Another object is to provide such an alignment process which eliminates the need for a photoresist blocking mask during an etching step.

A further object is to provide such a process for forming alignment marks on sandwich structures or other structures where one side of the structure is covered or otherwise inaccessible for alignment procedures.

BRIEF DESCRIPTION OF THE DRAWING

FIGS. 5A–5G illustrate the process steps of another embodiment of the invention.

BRIEF DESCRIPTION OF THE PREFERRED EMBODIMENT

A surprisingly large number of applications require the precise alignment of a photoresist mask to both the front and back surfaces of a silicon wafer. As the aerospace and automotive industries begin using silicon for transducers for measuring pressure, flow, acceleration etc., the need for double-sided alignment has become more apparent. For silicon transducers and other micromechanical applications of silicon, see "Silicon as a Mechanical Material", K. E. Petersen, Proceedings of the IEEE, May 1982, pages 420–457. Silicon is suitable for such micro-mechanical devices because the yield strength of silicon is 2.5 times that of stainless steel. Presently, double-sided alignment is being accomplished by aligning a contact mask to one side of the silicon wafer and, then, locking the wafer into position by means of a mechanical fixture. A second contact mask is then aligned to the first mask by means of alignment marks located at the edges of both masks. Once aligned, the entire assembly is clamped, and the exposure of the photoresist takes place. The problem with this approach is that it is extremely labor intensive, requires a significant amount of handling, is slow and not adaptable to automation, and cannot take advantage of modern projection printing tools.

My invention is a relatively simple process which eliminates all of the foregoing problems and which can be implemented with existing equipment.

Figure 1:
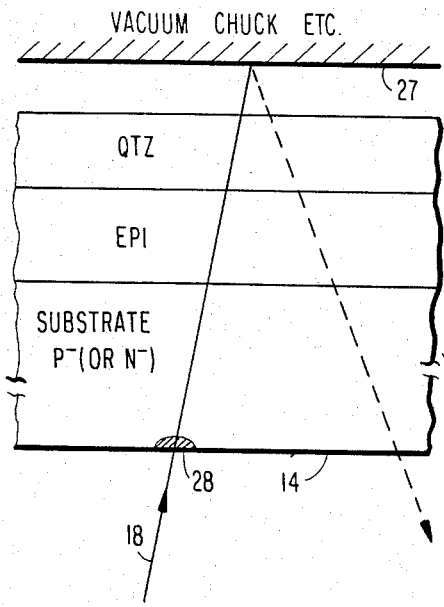
FIG. 1 schematically illustrates the manner in which a laser beam passes through a semiconductor body without an heavily doped internal region.
Figure 2:
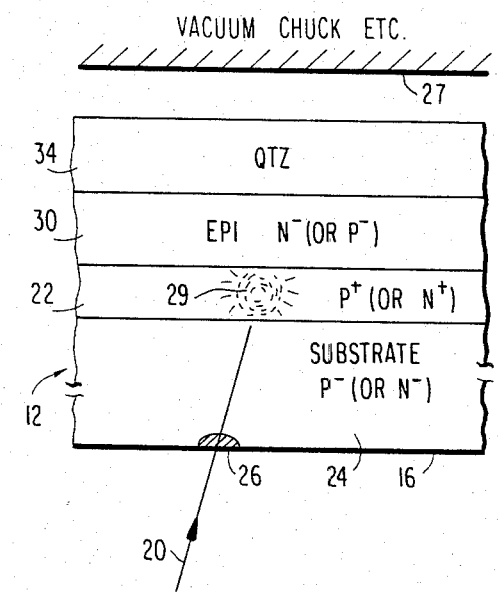
FIG. 2 schematically illustrates the method of this invention wherein the laser beam is absorbed in an heavily doped internal region within a semiconductor body.

FIGS. 1 and 2 show silicon wafers 10 and 12 being scribed on their back sides 14 and 16, respectively, by means of laser beams 18 and 20. In both cases, the laser beams are shown inclined at an angle for clarity of illustration, but, in practice the beams impinge at normal incidence to the planar back surfaces of the wafers. The difference between the two wafers is that wafer 12 (FIG. 2) contains a buried P+ or N+ layer 22 immediately above the lightly doped substrate 24, while wafer 10 does not. In the case of bipolar transistor fabrication, the heavily doped layer 22 corresponds to a buried isolation or (blanket) sub-collector. For micro-mechanical structures, layer 22 might correspond to the typical boron etch stop, usually a blanket.

The wavelength of the laser beam is selected to be in the near infrared band beyond the band edge of intrinsic silicon. (Such a wavelength can be obtained by merely removing the detachable frequency doubler from a conventional scribing laser). Thus, typically the shortest practical wavelength would be 1.1 microns, and the longest practical wavelength would be determined by the required resolution.

Figure 3:
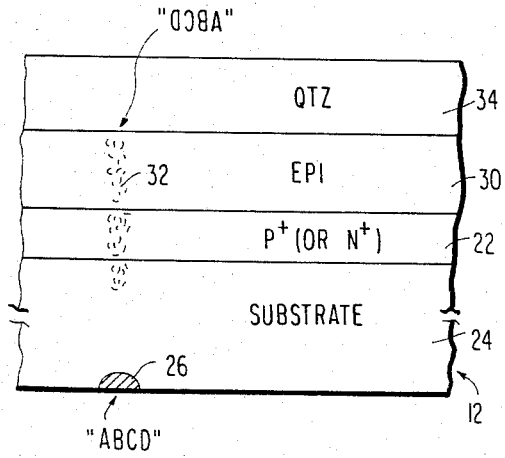
FIG. 3 illustrates the manner in which the defects induced in the internal region are caused to migrate to the front side of the body upon the application of heat in accordance with the invention.
Figure 4:
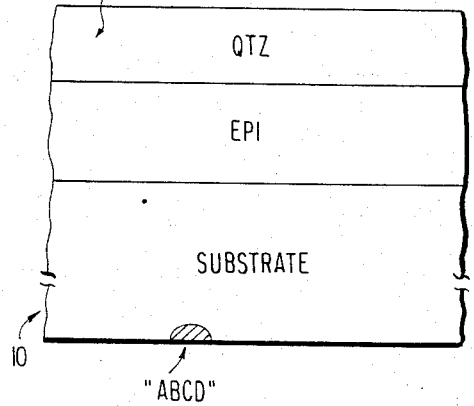
FIG. 4 illustrates the manner in which the front side of a semiconductor wafer remains blank when the wafer does not contain an heavily doped internal region.

In both cases, the electromagnetic flux from the laser beam is dissipated as heat in the back sides of the wafers to form the characteristic scribe marks 26 and 28. The remaining flux continues into the lightly doped wafer substrate which is essentially transparent to the chosen laser wavelength. However, in FIG. 1, the laser beam continues through the remaining lightly doped layer of silicon until it hits the vacuum chuck 27 where it is either harmlessly dissipated or reflected back through and out of the wafer. In FIG. 2, which illustrates the first step of my invention, the laser beam 20 strikes the heavily doped region 22 where the flux couples to the free carriers produced by the high doping concentration, with a resultant increase in this region's absorption coefficient by a factor of three orders of magnitude. Since the heavily doped layer 22 is typically two or three microns thick, the absorbed power density rises dramatically, and enough so as to generate microscopic defects 29 in this layer. At this point, an alignment mark exists only on the back side 16 of the wafer 12 at the point 26. However, if the wafer is then heated, then, in a manner reminiscent of "secret ink", the scribing appears on the front side of the wafer as shown in FIG. 3. On the other hand, and as shown in FIG. 4 for comparison, the wafer 10, without the heavily doped internal layer, even though subjected to the identical heat treatment, remains blank on its front side. The dividing line between "heavily" doped and "lightly" doped is $3 \times 10^{18}$ atoms of dopant per cubic centimeter.

It is believed that the mechanism by which propagation of defects occurs is as follows. The localized stress induced in the heavily doped layer 22 propagates the microscopic defects upwards towards the surface of the epi-layer 30 and also downward some distance into the substrate 24 as indicated by the reference numeral 32 in FIG. 3. The heat required to produce such defect propagation vertically in <100> wafers is relatively low. For example, the structures illustrated in FIGS. 1–4 were subjected to a quartz steam anneal at 700° C. for a period of one hour. In this case, the letter P was scribed on the back side of the wafer and a clear mirror image of the letter was seen on the front side of the wafer through a high powered optical microscope. Photographs of the mirror image were taken. In other words, the effect was as if the observer were reading the original laser scribe mark right through the wafer.

Typical thicknesses of the layers shown in FIGS. 1–4 are as follows:
 Substrate: 400–600 microns
 Layer 22: 1 micron to four microns
 Epi-Layer 30: ½ to 10 microns
 Quartz Layer 34: 0.01–10 microns.

The process has several advantages. For example, in some fabrication procedures, the substrate 24 containing the laser-scribed alignment mark 26 may be removed. However, with my process the alignment mark is preserved at the top surface of the epi-layer 30. The presence of the induced defects in an heavily boron-doped layer 22 at the precise location of the laser-scribed alignment marks offers another advantage; that is, anisotropic etching (e.g., with an E.D.P. etchant) will occur only in those regions of the layers 22 and 30 which are defined by the induced defects, the remaining P+ layer functioning as the normal etch stop. Thus, the heavily doped layer 22 with the laser-induced defects performs the function of a buried etch mask which, without my invention, requires a blocking mask to prevent the P+ from occurring where it is desired to continue etching to provide etched alignment marks. In other words, my invention eliminates the need for the blocking mask.

FIGS. 5A to 5G illustrate still another embodiment for providing alignment for sandwich structures where one side of the semiconductor body is covered and cannot be physically seen. In FIG. 5A there is shown an heavily doped substrate 40 having a lightly doped epi-layer 42 covered by a transparent oxide layer 44, for example. In this embodiment, the laser beam 46 (FIG. 5B) must be directed onto the top side where it passes through the thin, transparent oxide layer 44 and layer 42 whose top surface is, thus, optically exposed, scribing alignment marks 48 and 50 in the top surfaces of layers 44 and 42, respectively, and inducing defects 52 in the heavily doped substrate 40. FIG. 5C shows the migration path 54 of the defects upon the application of heat (which may occur during a normal annealing step); the defects migrate both upwardly to the top surface of the epi-layer 42 and also downwardly into the heavily doped substrate 40.

As shown in FIG. 5D, a photoresist masking step is used to fabricate in the oxide layer 44 some structure 55, such as polysilicon, silicide or a device, using for mask alignment the scribed marks 48 and 50 or even the visible defects. This fabricated structure, itself, forms another alignment feature. However, as shown in FIG. 5E, an opaque SOI (silicon-on-insulator) structure 56 is formed on top of the wafer by depositing a quartz insulating layer 58 to which another opaque silicon wafer 60 is bonded. Now, as shown in FIG. 5F, the original substrate is removed by an isotropic, concentration-dependent etchant, such as HNA in the ratio of 1:3:8. Since the lightly doped epi-layer 42 acts as a substantially complete etch stop, without my invention there would be left a completely featureless, flat bottom surface without any alignment marks (the top surface having been covered by the opaque silicon wafer 60). However, with my invention this etchant continues etching into the lightly doped layer 42 to form therein an etched alignment mark 62 which can be used for aligning additional structures to the now-concealed structure 55.

While there has been described what is presently considered to be the preferred embodiments of the invention, it will be obvious to those skilled in the art that various changes and modifications may be made therein without departing from the invention whose scope is limited only by the following claims.

It is claimed:

1. A method of forming alignment marks in a semiconductor body having a lightly doped first layer and an heavily doped second layer, said first layer having an optically exposed surface, comprising the steps of:

directing a laser beam onto said exposed surface in a direction perpendicular thereto, thereby forming in said exposed surface a scribed first alignment mark; and choosing the wavelength of the laser beam to be beyond the absorption edge of the material of said semiconductor body so that the beam passes through said first layer without absorption but is absorbed by said second layer to produce therein a defect representing a second alignment mark positioned identically to the scribed first alignment mark.

2. The method as defined in claim 1, wherein said heavily doped layer is covered by a lightly doped epitaxial layer, and further comprising the step of heating the semiconductor body until the defect propagates through said epitaxial layer to the external surface thereof to form therein a visible image of the scribed first alignment mark, said image being a second alignment mark positioned identically to the first alignment mark.

3. The method as defined in claim 1, wherein said second layer is a heavily doped substrate, said first layer is an epitaxial layer on said second layer, and further comprising the steps of:

heating the semiconductor body until the defect migrates through said first layer to the exposed surface thereof to form therein a visible image of the scribed first alignment mark and also through said first layer into said second layer, said image being a second alignment mark positioned identically to the scribed first alignment mark;

forming on said first layer a structure which conceals said first and second alignment marks; and etching away said substrate with an etchant which is stopped by said lightly doped first layer but which etches only into the defect region therein to form therein an etched third alignment mark identically positioned to said first and second alignment marks.

4. The method as defined in claim 2, wherein the material of the semiconductor body is silicon, and wherein the heating step comprises heating the body at a temperature of 700° C. for one hour.

5. The method as defined in claim 2, wherein said first layer is a substrate, said second alignment mark is concealed by a structure on said epitaxial layer, and said second layer is heavily doped with boron, further comprising the step of etching away said first layer with an etchant which is stopped by the heavily boron-doped second layer but which etches into said second and epitaxial layers only in the region of the defect to form an etched third alignment mark positioned identically to the scribed first alignment mark.

* * * * *